United States Patent
Zhang et al.

(10) Patent No.: US 9,290,836 B2
(45) Date of Patent: Mar. 22, 2016

(54) CRACK-RESISTANT ENVIRONMENTAL BARRIER COATINGS

(75) Inventors: James Zhang, Simpsonville, SC (US); Herbert Chidsey Roberts, Simpsonville, SC (US); Rupak Das, Greenville, SC (US)

(73) Assignee: General Electric Company, Schenectady, NY (US)

( * ) Notice: Subject to any disclaimer, the term of this patent is extended or adjusted under 35 U.S.C. 154(b) by 216 days.

(21) Appl. No.: 13/588,051

(22) Filed: Aug. 17, 2012

(65) Prior Publication Data

US 2014/0050898 A1 Feb. 20, 2014

(51) Int. Cl.
| | |
|---|---|
| *B05D 5/00* | (2006.01) |
| *C23C 4/02* | (2006.01) |
| *C23C 4/18* | (2006.01) |
| *C23C 16/02* | (2006.01) |
| *C23C 16/56* | (2006.01) |
| *C23C 30/00* | (2006.01) |
| *C04B 41/89* | (2006.01) |
| *C04B 41/00* | (2006.01) |
| *C04B 41/52* | (2006.01) |
| *F01D 5/28* | (2006.01) |

(52) U.S. Cl.
CPC ............. *C23C 4/02* (2013.01); *C04B 41/009* (2013.01); *C04B 41/52* (2013.01); *C04B 41/89* (2013.01); *C23C 4/18* (2013.01); *C23C 16/02* (2013.01); *C23C 16/56* (2013.01); *C23C 30/00* (2013.01); *F01D 5/288* (2013.01); *F05D 2240/121* (2013.01); *F05D 2240/122* (2013.01); *F05D 2240/125* (2013.01); *F05D 2240/303* (2013.01); *F05D 2240/304* (2013.01); *F05D 2240/307* (2013.01); *Y10T 428/24793* (2015.01)

(58) Field of Classification Search
CPC ...... B05D 2401/32; B05D 5/06; C23C 16/02; C23C 30/00; C23C 16/56; C23C 4/02; C23C 4/18

See application file for complete search history.

(56) References Cited

U.S. PATENT DOCUMENTS

| | | | |
|---|---|---|---|
| 4,503,130 A | 3/1985 | Bosshart et al. | |
| 4,764,089 A | 8/1988 | Strangman | |
| 5,169,689 A * | 12/1992 | Thompson et al. | 427/372.2 |
| 6,165,600 A | 12/2000 | Ivkovich, Jr. et al. | |
| 6,670,046 B1 * | 12/2003 | Xia | 428/469 |
| 6,699,607 B1 | 3/2004 | Spitsberg | |
| 6,979,498 B2 | 12/2005 | Darolia et al. | |
| 7,544,520 B2 * | 6/2009 | Duda et al. | 438/4 |
| 7,740,948 B1 | 6/2010 | Alvin | |
| 7,927,714 B2 | 4/2011 | Carter et al. | |

(Continued)

*Primary Examiner* — Xiao Zhao
(74) *Attorney, Agent, or Firm* — Ernest G. Cusick; Frank A. Landgraff

(57) ABSTRACT

Methods suitable for reducing corner cracking of environmental barrier coating systems. The methods include forming at least one layer of a first portion of the environmental barrier coating system on at least a first region of the component, performing a first heat treatment, forming at least one layer of a second portion of the environmental barrier coating system on a second region of the component, and performing a second heat treatment to the component. Edges of the first portion and edges of the second portion form an angle of at most 60° with respect to a surface of the first region of the component. During the second heat treatment, the second portion of the EBC system expands and the expansion of the second portion of the EBC system is at least partially constrained by the first portion of the EBC system to reduce tensile interfacial stresses in the EBC system.

18 Claims, 7 Drawing Sheets

(56) References Cited

U.S. PATENT DOCUMENTS

| | | |
|---|---|---|
| 2005/0022921 A1 | 2/2005 | Morrison et al. |
| 2005/0287296 A1 | 12/2005 | Wadley et al. |
| 2006/0091546 A1 | 5/2006 | Bostanjoglo et al. |
| 2008/0220177 A1* | 9/2008 | Hass et al. .................. 427/446 |
| 2009/0017260 A1 | 1/2009 | Kulkarni et al. |

* cited by examiner

After heat treatment

Before heat treatment

After heat treatment

After heat treatment

CRACK-RESISTANT ENVIRONMENTAL BARRIER COATINGS

BACKGROUND OF THE INVENTION

The present invention generally relates to ceramic matrix composite (CMC) components and processes for their production. More particularly, this invention provides a method to reduce corner cracking and delamination of environmental barrier coating (EBC) systems at corners of CMC components.

Higher operating temperatures for gas turbine engines are continuously being sought in order to improve their efficiency. However, as operating temperatures increase, the high temperature durability of the components of the engine must correspondingly increase. Significant advances in high temperature capabilities have been achieved through the formulation of iron, nickel, and cobalt-based superalloys. While superalloys have found wide use for components used throughout gas turbine engines, and especially in the higher temperature sections, alternative lighter-weight component materials have been proposed.

Ceramic matrix composites (CMCs) are a class of materials that include a reinforcing material surrounded by a ceramic matrix phase. Such materials, along with certain monolithic ceramics (i.e., ceramic materials without a reinforcing material), are currently being used for higher temperature applications. These ceramic materials are lightweight compared to superalloys, yet can still provide strength and durability to the component made therefrom. Therefore, such materials are currently being considered for many gas turbine components used in higher temperature sections of gas turbine engines, such as airfoils (e.g., turbines and vanes), combustors, shrouds and other like components, that would benefit from the lighter weight and higher temperature capability these materials can offer.

CMC and monolithic ceramic components can be coated with environmental barrier coatings (EBCs) to protect them from the harsh environment of high temperature engine sections. EBCs can provide a dense, hermetic seal against the corrosive gases in the hot combustion environment, which can rapidly oxidize silicon and silicon carbide in CMCs and monolithic ceramics. Additionally, silicon oxide is not stable in high temperature steam, but is converted to volatile (gaseous) silicon hydroxide species. Thus, EBCs can help prevent dimensional changes in the ceramic component due to such oxidation and volatilization processes. Currently, EBCs are applied using standard, industrial coating processes such as plasma spray (APS) and vapor deposition (i.e. chemical vapor deposition, CVD, and electron beam physical vapor deposition, EBPVD). Thereafter, a heat treatment may be performed to relieve residual stresses created during cooling from elevated application temperatures.

As a nonlimiting example of a CMC component, FIG. 1 schematically represents a bucket 10 of a land-based gas turbine engine of a type used in the power generation industry. As represented in FIG. 1, the bucket 10 comprises an airfoil 12 extending from a shank 14. The bucket 10 is further represented as being equipped with a dovetail 16 formed on its shank 14 by which the bucket 10 can be conventionally anchored to a rotor wheel (not shown) as a result of being received in a complementary slot defined in the circumference of the wheel. The dovetail 16 is conventionally configured to be of the axial entry type, in which the dovetail 16 has a fir tree shape adapted to mate with a complementary-shaped dovetail slot in a rotor wheel. The airfoil 12 of the bucket 10 is directly subjected to the hot gas path within the turbine section of a gas turbine engine. The bucket 10 is also represented as having a platform 18 that forms a portion of the radially inward boundary of the hot gas path and, consequently, experiences very high thermal loads. Other relatively conventional features of the bucket 10 include sealing flanges (angel wings) 19 that project axially away from the forward and aft ends of the shank 14.

The conventional EBC application processes discussed above are prone to induce defects such as through-the-thickness and interfacial cracks, especially at corners due to tensile strain induced by the heat treatment performed after the application process. For example, in reference to FIG. 1, a trailing edge and a leading edge of the airfoil 12 are prone to cracking FIG. 2 depicts a series of photographs of an EBC on a CMC component, such as the bucket 10 represented in FIG. 1, showing the progression of vertical cracking and delamination due to tensile strain. FIG. 3 is a force diagram representing the forces that are present as a result of conventional EBC application processes and influence the occurrence of cracking of an EBC system at its corners. The EBC system will generally extend after one heat treatment cycle in both the circumferential and the radial directions, thus a coating thickness t is represented as experiencing a normal force N and a shear force T on the cross-section of the EBC system, interfacial normal stresses $\sigma_r$, and hoop stress $\sigma_\theta$ at the corner. The simple free-body diagram represented in FIG. 3 illustrates that under certain conditions, particularly as corners become small and sharp, the interfacial stress $\sigma_r$ likely to be tensile stress inducing a positive (tensile) hoop stress $\sigma_\theta$. This tensile hoop stress $\sigma_\theta$ and the tensile interfacial stress $\sigma_r$ promote EBC cracking and delamination at sharp corners.

Prior attempts to solve cracking and delamination problems of EBC systems include forming interlocking features between layers of an EBC system, forming strain relief grooves in EBC layers, forming grooved bonding surfaces in EBC layers, forming EBC layers with reinforcing particles, as well as a variety of other methods. As an example, U.S. Pat. No. 4,503,130 to Bosshart et al. discloses a process of applying a graded ceramic coating to a metal substrate. During the coating process, the temperature of the substrate is controlled in predetermined degree for establishing residual stress and strain patterns in the manufactured seal. Substrate heaters are provided for this purpose. Although the prior art above describe their methods as providing for reduced cracking and delamination of EBC systems, improved methods are needed to address the cracking and delamination of EBC systems at corners of CMC components.

In view of the above, there is an ongoing need for methods capable of reducing stresses that can induce cracking and delamination at corners of EBC coating systems.

BRIEF DESCRIPTION OF THE INVENTION

The present invention provides methods suitable for reducing corner cracking and delamination of environmental barrier coating systems at corners of CMC components.

According to a first aspect of the invention, a method of forming an environmental barrier coating system on a component includes forming at least one layer of a first portion of the environmental barrier coating system on at least a first region of the component, performing a first heat treatment to the component, forming at least one layer of a second portion of the environmental barrier coating system on a second region of the component, and performing a second heat treatment to the component. The first portion of the environmental barrier coating system defines at least an edge and the second portion of the environmental barrier coating system defines at least an edge. The edges of the first portion and the edges of the second portion form an angle of at most 60° with respect to a surface of the first region of the component. During the second heat treatment, the second portion of the EBC system expands and the expansion of the second portion of the EBC system is at least partially constrained by the first portion of the EBC system to reduce tensile interfacial stresses in the EBC system.

According to a second aspect of the invention, a method of forming an environmental barrier coating system on a component of a gas turbine engine includes forming at least one layer of a first portion of the environmental barrier coating system on at least a first region of the component, performing a first heat treatment to the component, forming at least one layer of a second portion of the environmental barrier coating system on a second region of the component, and performing a second heat treatment to the component. The first portion of the environmental barrier coating system defines at least an edge and the second portion of the environmental barrier coating system defines at least an edge. The edges of the first portion and the edges of the second portion form an angle of at most 60° with respect to a surface of the first region of the component. During the second heat treatment, the second portion of the EBC system expands and the expansion of the second portion of the EBC system is at least partially constrained by the first portion of the EBC system to reduce tensile interfacial stresses in the EBC system.

A technical effect of the invention is the ability to reduce the incidence and/or extent of cracking and delamination of an EBC system, thereby improving the EBC system reliability without changing its structure and chemical composition. In particularly, it is believed that, by configuring an EBC system to comprise at least two adjacent portions so that they have adjacent edges that abut, compressive interfacial stresses can be induced at the edges in a manner that reduces tensile hoop stresses that tend to promote cracking and delamination at corners of the EBC system.

Other aspects and advantages of this invention will be better appreciated from the following detailed description.

DETAILED DESCRIPTION OF THE INVENTION

The present invention is generally applicable to components that operate within environments characterized by relatively high temperatures, severe thermal cycling and stresses, oxidation, and corrosion. Notable examples of such components include high and low pressure turbine vanes (nozzles) and blades (buckets), shrouds, combustor liners, augmentor hardware, and other hot section components of turbine engines, though the invention has application to other components. For clarity, the present invention will be described in reference to a bucket 10 of a land-based gas turbine engine of a type used in the power generation industry as represented in FIG. 1.

In accordance with embodiments of this invention, the bucket 10 is a silicon-based component. Notable examples of silicon-containing materials include those with a dispersion of silicon carbide, silicon nitride, a silicide (for example, a refractory metal or transition metal silicide) and/or silicon as a reinforcement material in a metallic or nonmetallic matrix, as well as those having a silicon carbide, silicon nitride, silicide and/or silicon-containing matrix, and particularly composite materials that employ silicon carbide, silicon nitride, a silicide and/or silicon as both the reinforcement and matrix materials. Of particular interest are ceramic matrix composites (CMC) that contain silicon carbide as the reinforcement and matrix phase.

Figure 1:
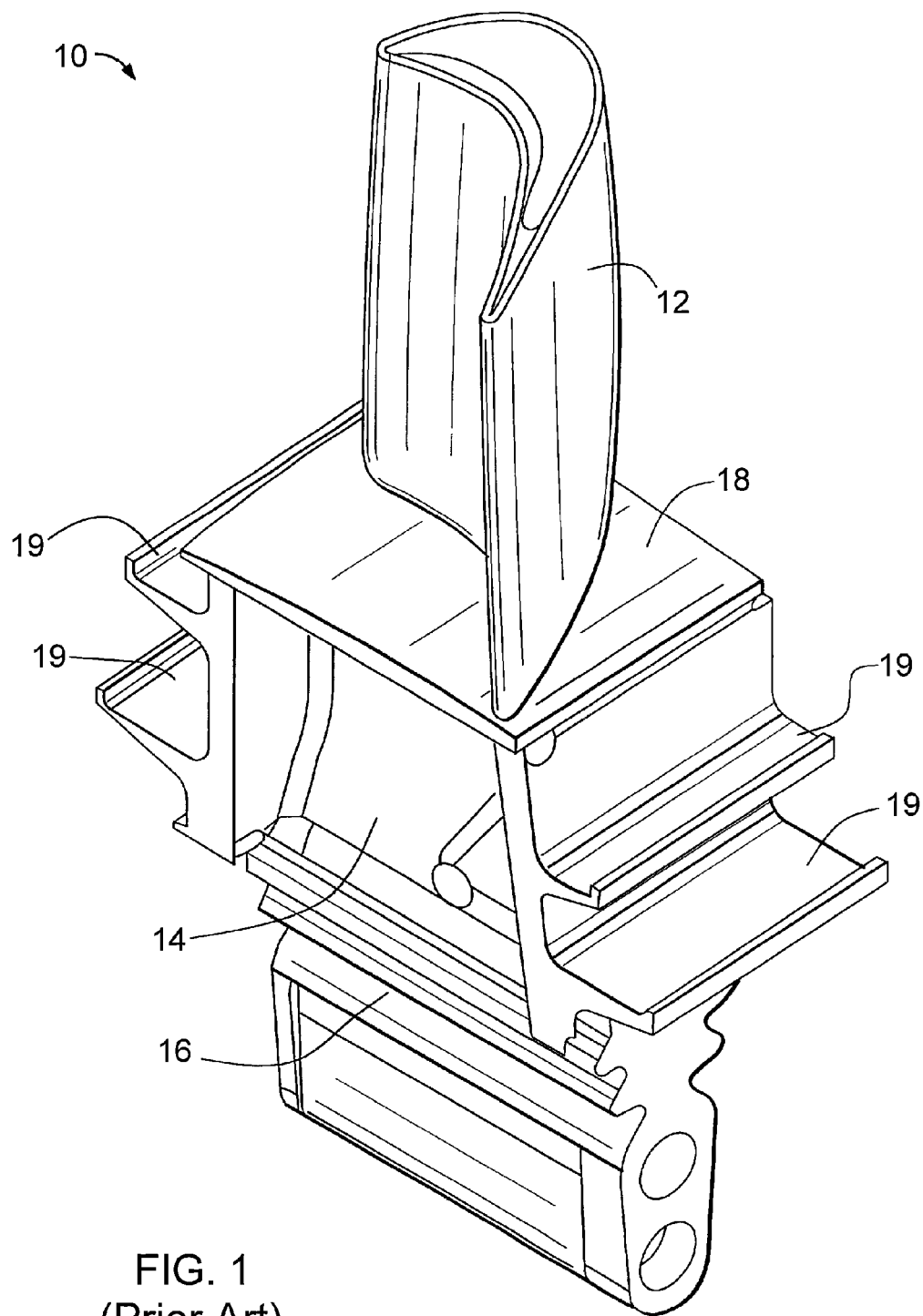
FIG. 1 is a perspective view that represents an exemplary bucket of a land-based turbine engine.
Figure 2:
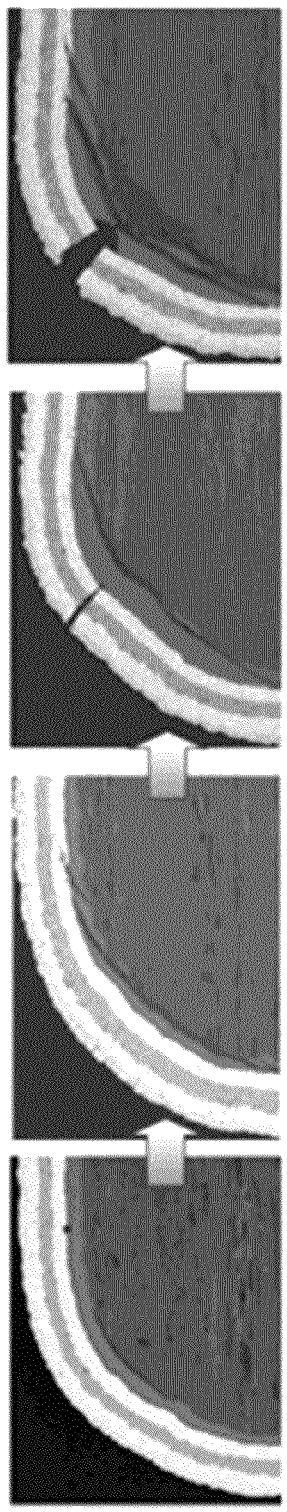
FIG. 2 is a scanned image that represents cross-sectional views of the microstructure of an EBC system on a CMC component and illustrating the progression of cracking and delamination that may occur during a heat treatment of the EBC system.
Figure 8A:
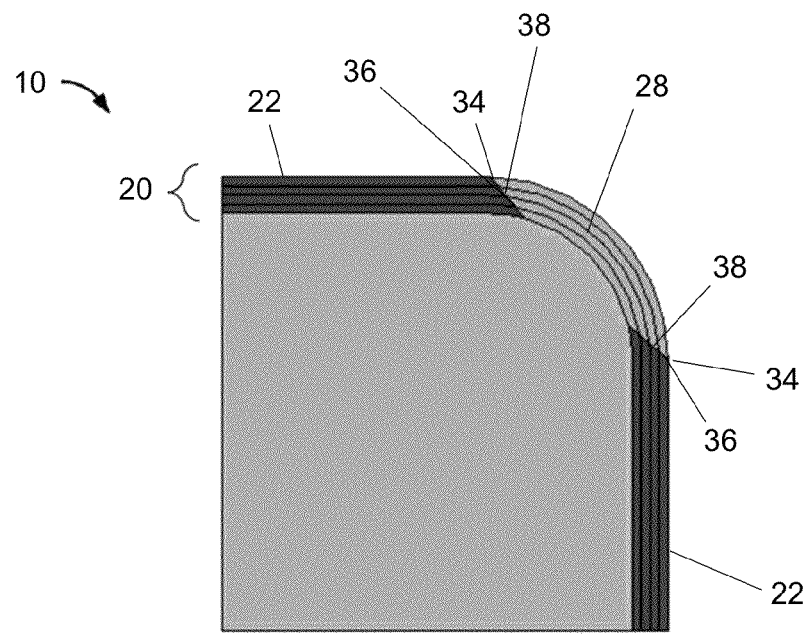
FIGS. 8A-B and 9A-B represent joint configurations in accordance with certain aspects of this invention.

FIG. 8A represents a cross-sectional view of a small section of the bucket 10 from FIG. 1 including two flat regions 24 and a corner 26. In a first embodiment of the present invention, the bucket 10 is protected by an environmental barrier coating (EBC) system 20 as represented in FIG. 8A. Although the EBC system 20 is represented as having multiple layers, a variety of different EBC systems comprising one or more layers are foreseeable for the bucket 10. These layers of the EBC system 20 can include, but are not limited to, one or more bondcoats, transition or intermediate layers, and/or topcoats. The EBC system 20 is intended to provide environmental protection to the bucket 10, as well as to potentially reduce the operating temperature of the bucket 10, thereby enabling the bucket 10 to survive within higher temperature environments than otherwise possible. Suitable materials for the EBC system 20 include, but are not limited to, elemental silicon or silicon-containing compositions (SiC, $Si_3N_4$, etc.) for the bondcoats, silicates, alkaline-earth metal aluminosilicates and/or rare-earth metal silicates, and particularly compounds of rare-earth oxides and silicates such as barium-strontium-aluminosilicates (BSAS) and other alkaline-earth aluminosilicates for transition or intermediate layers, and zirconia partially or fully stabilized with yttria (YSZ) alone or with additions of rare-earth oxides for the topcoats.

Within the small section of the bucket 10 represented in FIG. 8A, the EBC system 20 comprises multiple portions including first portions 22 and a second portion 28. The first portions 22 and the second portion 28 have edges 36 and 38 respectively that form a joint 34. Although the edges 36 and 38 are represented as being formed at a slope wherein the thickness of each edge 36 of the first portions 22 decreases toward the corner 26 and the second portion 28 defines edges 38 that overlay the edges 36 of the first portions 22, it is within the scope of this invention that the slope of the edges 36 and 38 are reversed (that is, negative) wherein the thickness of each edge 38 of the second portion 28 decreases away from the corner 26 and the first portions 22 define edges 36 that overlay the edges 38 of the second portion 28. The slope of the edges 36 and 38 are termed herein as a slant angle θ wherein the slant angle θ is measured between the edges 36 and 38 and a line perpendicular to the flat regions 24.

The EBC system 20 may be applied by any conventional process known in the art. For example, suitable processes include, but are not limited to, atmospheric plasma spray (APS), chemical vapor deposition (CVD), plasma enhanced CVD (PECVD), dip coating or electro-phonetic deposition (EPD), laser cutting or mechanical grinding. Thereafter, a heat treatment is performed to relieve residual stresses created during cooling from elevated application temperatures.

Figure 3:
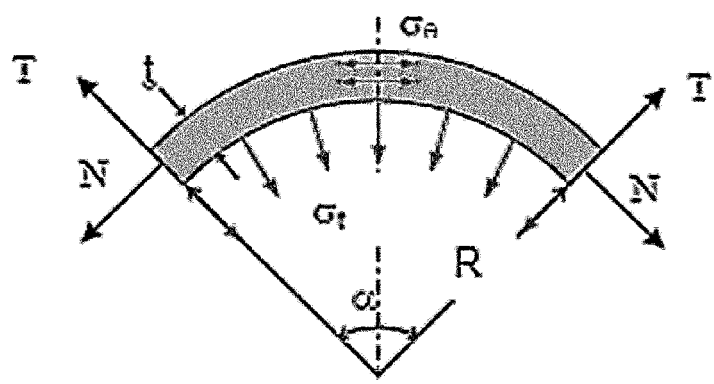
FIG. 3 is a graphic that represents forces and stresses within an EBC system at a corner of a CMC component.

As previously discussed in reference to FIG. 3, conventional application processes for EBC system 20 are prone to induce defects such as through-the-thickness and interfacial cracks, especially within layers of the EBC system 20 located at corners of the bucket 10 protected by the EBC system. Such defects are believed to be due to tensile (positive) hoop stress $\sigma_\theta$ induced during the heat treatment that follows the application process. To limit or prevent tensile hoop stress $\sigma_\theta$, the present invention encompasses the application of the EBC system 20 in a multi-step process intended to generate compressive (negative) hoop stress $\sigma_\theta$ in the EBC system 20 at the corners of the bucket 10 so as to reduce the risk of through-the-thickness cracking and delamination.

Figure 4:
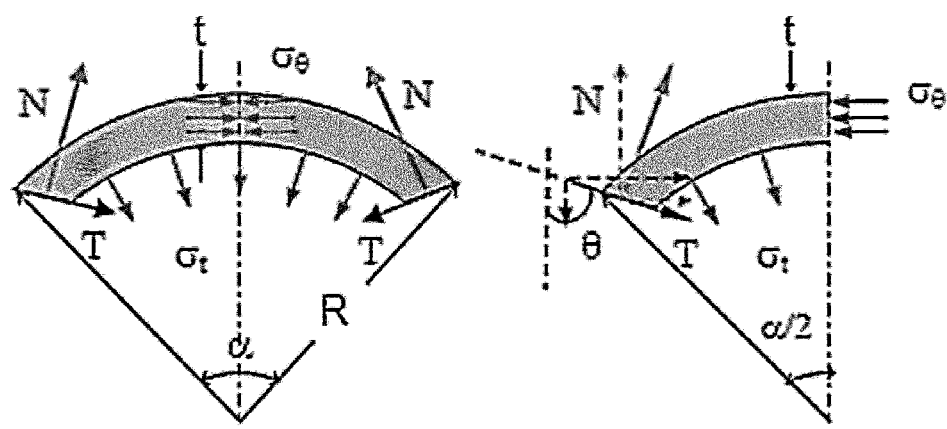
FIG. 4 is a graphic that represents forces and stresses within an EBC system that is located at a corner of a CMC component and has been applied in accordance with a method of this invention.

According to a preferred aspect of the invention, a multi-step application process is employed wherein previously applied portions of the EBC system 20 are preferably utilized to induce compressive hoop stress $\sigma_\theta$ and generate upward lifting shear stress T at the corners, as shown in FIG. 4. This compressive hoop stress $\sigma_\theta$ is believed to be capable of inhibiting if not preventing through-thickness cracking and delamination within the EBC system 20. Under certain conditions, the interfacial stress $\sigma_t$ can induce compressive hoop stress $\sigma_\theta$, particularly as the slant angle θ decreases. Compressive hoop stress $\sigma_\theta$ in the EBC system 20 due to this multi-step process can improve the durability and reliability of the EBC system 20 and therefore the bucket 10.

Figure 5:
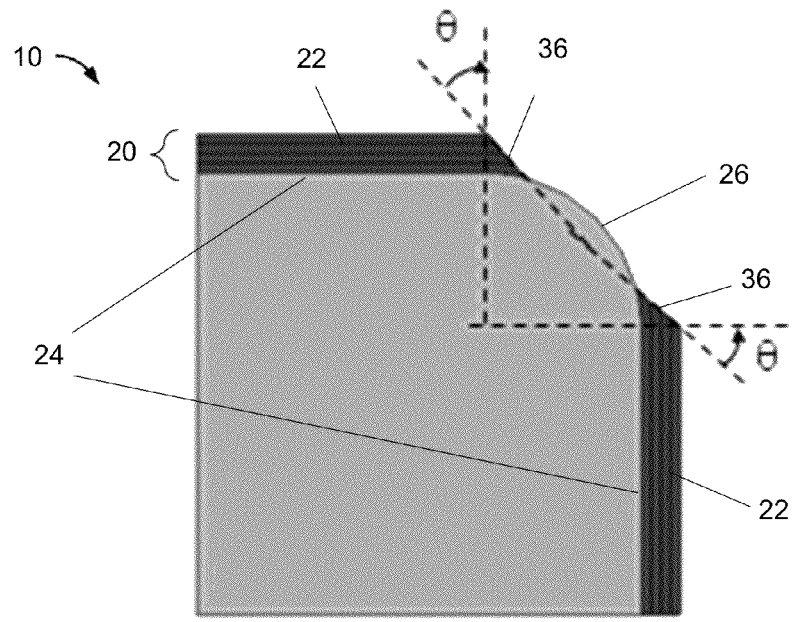
FIGS. 5 through 7 and 10 represent steps carried out for applying an EBC system on a CMC component in accordance with a method of this invention.

FIG. 5 represents an initial step of a multi-step process in accordance with a nonlimiting embodiment of the present invention wherein the first portions 22 of the EBC system 20 have been deposited on the flat regions 24 of the bucket 10 leaving the corner 26 uncoated. These coated flat regions 24 define a first region of the bucket 10. Though the first portions 22 are represented as multiple layers, it should be understood that either or each of the first portions 22 could be a single layer or constitute all of the layers of a multi-layer EBC system. The edges 36 of the first portions 22 have been formed at a slope of slant angle θ. The slope of the edges 36 may be formed by any suitable method including, but not limited to, chemical etching, mechanical grinding, and laser cutting.

Once the flat regions 24 have been coated, the bucket 10 may undergo a first heat treatment resulting in the first portions 22 preferably expanding to relieve stresses in the EBC system 20. The parameters of the heat treatment will be specific to and dependent on the component and EBC system 20 utilized.

Figure 6:
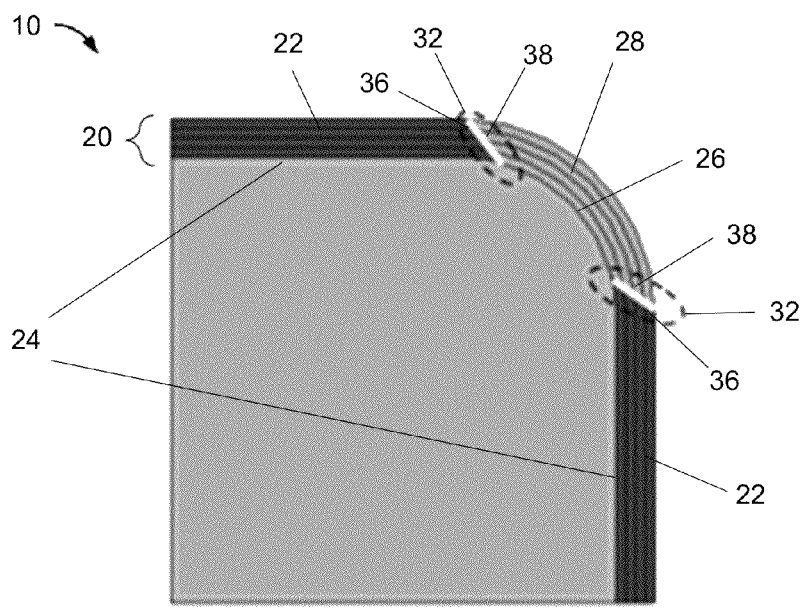

Thereafter, a second portion 28 of the EBC system 20 is deposited on a second region of the bucket 10 represented in FIG. 6 as including the corner 26 between the flat regions 24 of the bucket 10 that were previously coated. Gaps 32 are represented as being left between the first and second portions 28 of the EBC system 20. These gaps 32 allow the second portion 28 of the EBC system 20 room to expand during a subsequent heat treatment. A non-limiting method of forming the gaps 32 includes placing a sacrificial body or film over the edges 36 of the first portions 22 which can be removed or burned off after depositing the second portion 28. Alternatively, the gaps 32 can be formed by cutting away sections of the second portion 28 after it has been deposited with a laser. The dimensions of the gaps 32 may be tailored to each individual application and may be dependent on the materials used and the compressive stress desired. Preferably, the gaps 32 have a width of at most one percent of total length of the second portion 28 of the EBC system 20, and more preferably between about one half and one percent of the total length of the second portion of the EBC system. Once the second portion 28 has been deposited and the gaps 32 have been formed, a second heat treatment is performed. Preferably, the second heat treatment has the same parameters as the first heat treatment; however, applications are foreseeable wherein a different heat treatment may be desirable.

Figure 7:
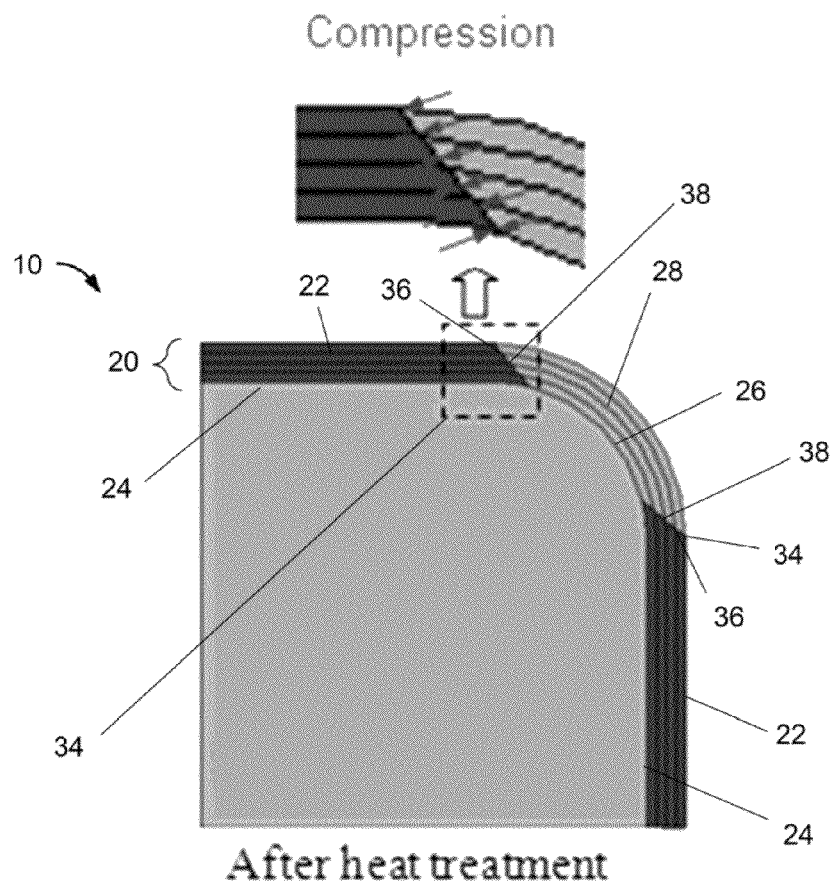

During the second heat treatment, the second portion 28 of the EBC system 20 preferably expands overlapping and contacting the first portions 22 of the EBC system 20 to form the joints 34, as represented in FIG. 7. It is believed that this expansion will result in compressive interfacial stress $\sigma_t$ and preferably compressive hoop stress $\sigma_\theta$ to be generated at the joints 34 as the second portion 28 of the EBC system 20 is constrained by the first portions 22 of the EBC system 20. This compressive hoop stress $\sigma_\theta$ is believed to be capable of inhibiting if not preventing through-thickness cracking and delamination within the EBC system 20 thereby increasing the durability and reliability of the EBC system 20 and therefore the bucket 10.

Figure 10:
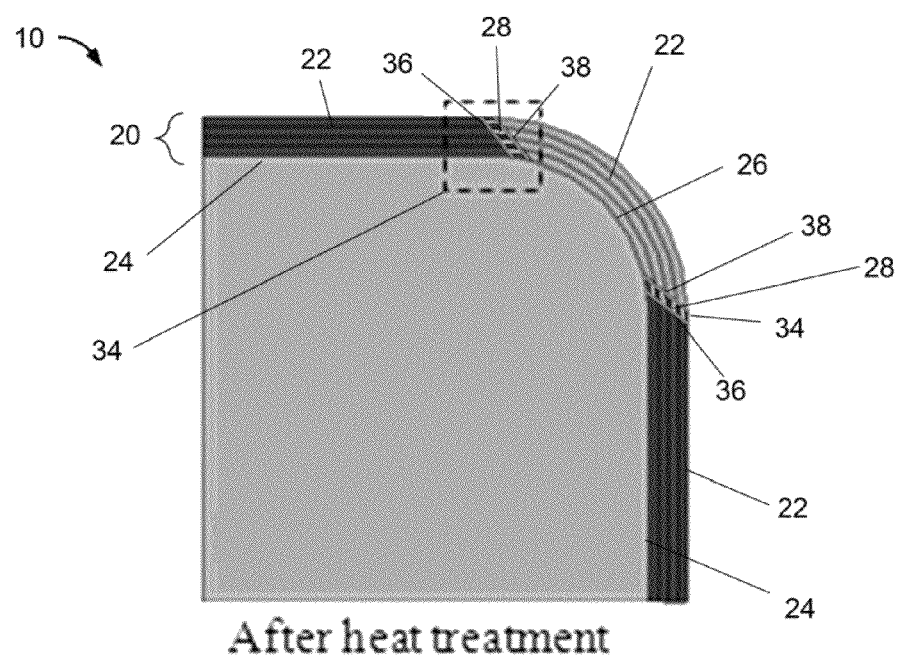

As an alternative to the above process, the first portions 22 are deposited on the flat regions 24 and the corner 26 therebetween of the bucket 10 in a single application step, leaving the gaps 32 between them using the same methods described above. After the first heat treatment, the second portion 28 of the EBC system 20 is applied to partially or completely fill the gaps 32 between the first portions 22 of the EBC system 20. The second heat treatment is then performed preferably causing the second portion 28 of the EBC system 20 to expand and be restrained by the first portions 22 to form the joints 34, as represented in FIG. 10. It is believed that this expansion will result in compressive interfacial stress $\sigma_t$ and preferably compressive hoop stress $\sigma_\theta$ to be generated at the joints 34 similar to the previously described embodiment above. In this embodiment, the flat regions 24 and corners 26 define the first region of the bucket 10 and the gaps 32 define the second region.

As discussed previously, the compressive interfacial stress $\sigma_t$ in the second portion 28 of the EBC system 20 is more likely to induce compressive hoop stress $\sigma_\theta$ as the angle θ decreases. Therefore, the edges 26 of the first portion 22 preferably are formed at the slant angles θ of less than about 60° with respect to the surface of the first region 24 of the bucket 10. However, the slant angles must also be sufficient to induce the aforementioned desired upward-lifting shear stresses on the second portion 28 at the joints 34, as represented in FIG. 4. Consequently, the joints 34 are preferably formed at slant angle θ of between about 20° and about 45°, and more preferably between about 30° and about 45°. While these ranges represent preferred angles for the slant angle θ, the magnitude of the slant angle θ is determined from the component's dimensions and material properties. Therefore, for certain applications it is possible to form the slant angle θ at an angle of 0° or even a negative angle, that is, the angle is formed inward towards the corners 26 as previously discussed, as long as the slant angle θ generates compressive interface stress $\sigma_t$ and preferably compressive hoop stress $\sigma_\theta$.

Figure 8B:
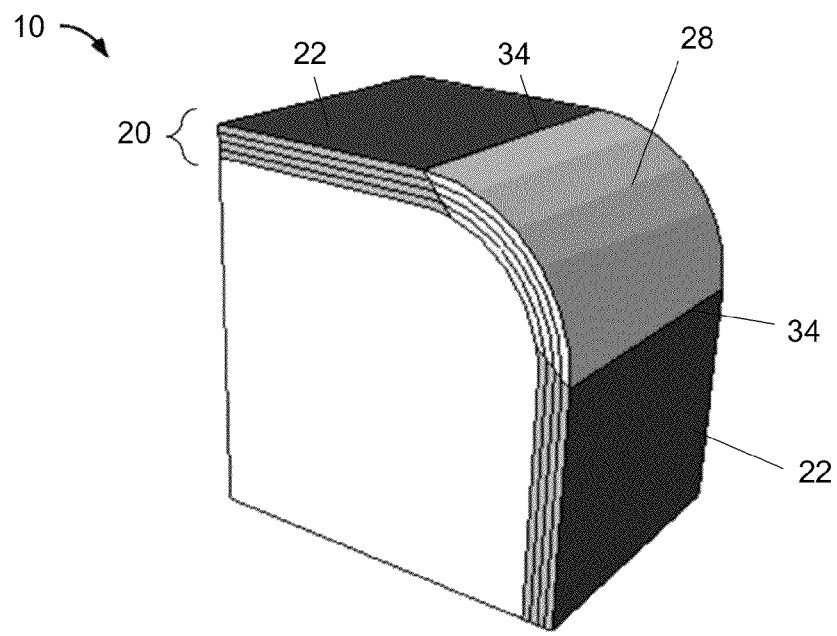
Figure 9A:
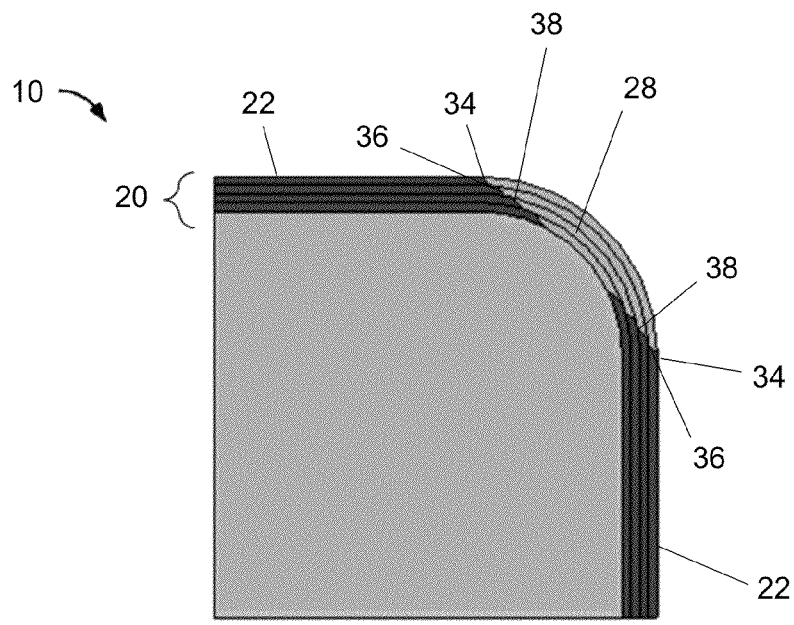
Figure 9B:
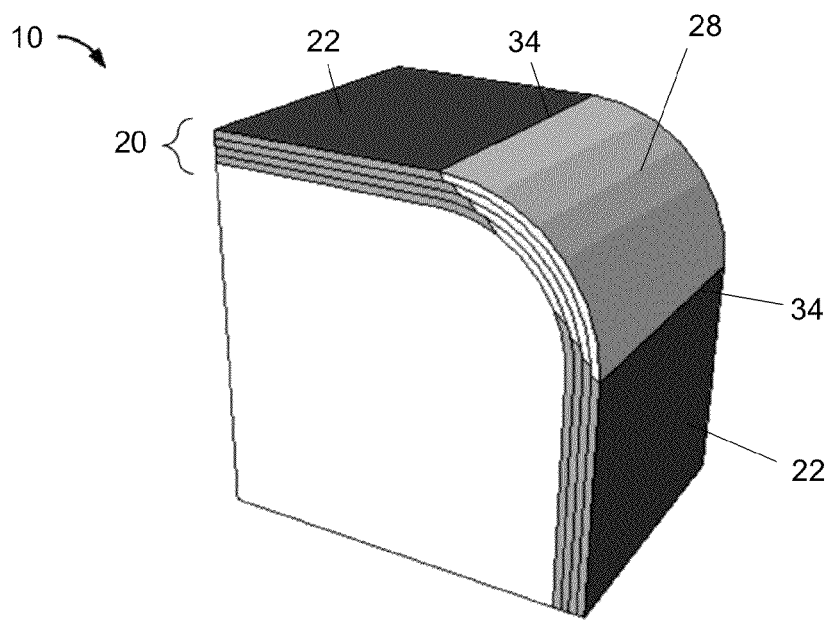

The joints 34 may be formed in any configuration suitable for inducing interfacial stress in the second portion 28 of the EBC system 20. FIGS. 8A, 8B, 9A and 9B represent two preferred joint configurations for joints 34 formed by the multi-step process described in FIGS. 5-7. FIGS. 8A and 8B represent a scarf joint configuration and FIGS. 9A and 9B represent a stepped joint configuration.

While the invention has been described in terms of specific embodiments, it is apparent that other forms could be adopted by one skilled in the art. For example, the regions of the component covered and the configurations of the joints could differ from that shown, and materials and processes other than those noted could be used. Therefore, the scope of the invention is to be limited only by the following claims.

The invention claimed is:

1. A method of forming an environmental barrier coating system on a component formed of a ceramic matrix composite (CMC) material, the method comprising:
   forming at least one layer of a first portion of the environmental barrier coating system on at least a first region of the component, wherein the first portion of the environmental barrier coating system defines at least a first edge; and then
   performing a first heat treatment to the component having the first portion of the environmental barrier coating system formed thereon; and then
   forming at least one layer of a second portion of the environmental barrier coating system on a second region of the component, wherein the second portion of the environmental barrier coating system defines at least a second edge, wherein the first edge of the first portion and the second edge of the second portion form an angle of at most 60° with respect to a surface of the first region of the component having the first portion of the environmental barrier coating system formed thereon; and then
   performing a second heat treatment to the component having the first portion and the second portion of the environmental barrier coating system formed thereon, wherein the second portion of the environmental barrier coating system expands during the second heat treatment and the expansion of the second portion of the environmental barrier coating system is at least partially constrained by the first portion of the environmental barrier coating system to reduce tensile interfacial stresses in the environmental barrier coating system.

2. The method of claim 1, wherein the first region of the component comprises flat surfaces of the component and the second region of the component comprises at least a corner of the component therebetween.

3. The method of claim 1, wherein the second portion of the environmental barrier coating system is formed in a manner so as to leave a gap between the first edge of the first portion and the second edge of the second portion of the environmental barrier coating system prior to performing the second heat treatment of the component.

4. The method of claim 3, wherein the gap between the first edge and second edge of the environmental barrier coating system has a width of at most about one percent of total length of the second portion of the environmental barrier coating system.

5. The method of claim 1, wherein the first region of the component comprises flat surfaces and at least a corner of the component therebetween, wherein the first portion of the environmental barrier coating system is formed in a manner so as to leave gaps between the flat surfaces and the corner therebetween, and the second region of the component comprises surfaces of the component located within the gaps between the first portions of the environmental barrier coating system.

6. The method of claim 1, wherein the first edge of the first portion of the environmental barrier coating system is formed at an angle of between about 20° and about 45° with respect to the surface of the first region of the component having the first portion of the environmental barrier coating system formed thereon.

7. The method of claim 1, wherein the second portion of the environmental barrier coating system overlays the first edge of the first portion of the environmental barrier coating system to form a scarf joint.

8. The method of claim 1, wherein the second portion of the environmental barrier coating system overlays the first edge of the first portion of the environmental barrier coating system to form a stepped joint.

9. The method of claim 1, wherein the expansion of the second portion is at least partially constrained by the first portion during the second heat treatment as a result of the first edge and the second edge physically contacting.

10. A method of forming an environmental barrier coating system on a component of a gas turbine engine formed of a ceramic matrix composite (CMC) material, the method comprising:
    forming at least one layer of a first portion of the environmental barrier coating system on at least a first region of the component, wherein the first portion of the environmental barrier coating system defines at least a first edge;
    performing a first heat treatment to the component having the first portion of the environmental barrier coating system formed thereon;
    forming at least one layer of a second portion of the environmental barrier coating system on a second region of the component, wherein the second portion of the environmental barrier coating system defines at least a second edge, wherein the first edge of the first portion and the second edge of the second portion form an angle of at most 60° with respect to a surface of the first region of the component having the first portion of the environmental barrier coating system formed thereon; and then
    performing a second heat treatment to the component having the first portion and the second portion of the environmental barrier coating system formed thereon, wherein the second portion of the environmental barrier coating system expands during the second heat treatment and the expansion of the second portion of the environmental barrier coating system is at least partially constrained by the first portion of the environmental barrier coating system to reduce tensile interfacial stresses in the environmental barrier coating system.

11. The method of claim 10, wherein the first region of the component comprises flat surfaces of the component and the second region of the component comprises a corner of the component therebetween.

12. The method of claim 10, wherein the second portion of the environmental barrier coating system is formed in a manner so as to leave a gap between the first edge of the first portion and the second edge of the second portion of the environmental barrier coating system prior to the second heat treating of the component.

13. The method of claim 12, wherein the gap between the first edge and second edge of the environmental barrier coating system have at most one percent of total length of the second portion of the environmental barrier coating system.

14. The method of claim 10, wherein the first region of the component comprises flat surfaces and at least a corner of the component therebetween, wherein the first portion of the environmental barrier coating system is formed in a manner so as to leave gaps between the flat surfaces and the corner, and the second region of the component comprises surfaces of the component located within the gaps between the first portions of the environmental barrier coating system.

15. The method of claim 10, wherein the first edge of the first portion of the environmental barrier coating system is formed at an angle of between about 20° and about 45° with respect to the surface of the first region of the component having the first portion of the environmental barrier coating system formed thereon.

16. The method of claim 10, wherein the second portion of the environmental barrier coating system overlays the first edge of the first portion of the environmental barrier coating system to form a scarf joint.

17. The method of claim 10, wherein the second portion of the environmental barrier coating system overlays the first edge of the first portion of the environmental barrier coating system to form a stepped joint.

18. The method of claim 10, wherein the expansion of the second portion is at least partially constrained by the first portion during the second heat treatment as a result of the first edge and the second edge physically contacting.

* * * * *